US012284856B2

(12) United States Patent
Huang et al.

(10) Patent No.: US 12,284,856 B2
(45) Date of Patent: Apr. 22, 2025

(54) DISPLAY DEVICE INCLUDING GAP BETWEEN BANK AND LIGHT-EMITTING ELEMENT, AND MANUFACTURING METHOD THEREOF

(71) Applicant: Au Optronics Corporation, Hsinchu (TW)

(72) Inventors: Pu-Jung Huang, Hsinchu (TW); Cheng-Yeh Tsai, Hsinchu (TW)

(73) Assignee: Au Optoronics Corporation, Hsinchu (TW)

( * ) Notice: Subject to any disclaimer, the term of this patent is extended or adjusted under 35 U.S.C. 154(b) by 627 days.

(21) Appl. No.: 17/511,596

(22) Filed: Oct. 27, 2021

(65) Prior Publication Data

US 2023/0069739 A1 Mar. 2, 2023

(30) Foreign Application Priority Data

Aug. 27, 2021 (TW) .................. 110131888

(51) Int. Cl.
| | |
|---|---|
| H10H 29/14 | (2025.01) |
| H10H 20/01 | (2025.01) |
| H10H 20/851 | (2025.01) |
| H10H 20/853 | (2025.01) |
| H10H 20/855 | (2025.01) |
| H10H 20/857 | (2025.01) |

(52) U.S. Cl.
CPC .......... H10H 29/142 (2025.01); H10H 20/01 (2025.01); H10H 20/851 (2025.01); H10H 20/853 (2025.01); H10H 20/855 (2025.01); H10H 20/857 (2025.01); *H10H 20/0361* (2025.01); *H10H 20/0362* (2025.01); *H10H 20/0364* (2025.01)

(58) Field of Classification Search
CPC ..... H01L 25/167; H01L 33/005; H01L 33/50; H01L 33/54; H01L 33/58; H01L 33/62; H01L 33/501; H01L 33/505; H01L 33/507; H01L 33/508; H01L 2933/0008; H01L 2933/0041; H10H 29/142; H10H 20/01; H10H 20/851; H10H 20/853; H10H 20/855; H10H 20/857; H10H 20/0361; H10H 20/0362; H10H 20/0364; H10H 20/8513
USPC .......................................................... 257/79
See application file for complete search history.

(56) References Cited

U.S. PATENT DOCUMENTS

| | | |
|---|---|---|
| 9,508,778 B2 | 11/2016 | Kim et al. |
| 2020/0295224 A1* | 9/2020 | Yanagawa ........... H01L 25/0753 |

(Continued)

FOREIGN PATENT DOCUMENTS

| | | |
|---|---|---|
| CN | 107180920 | 9/2017 |
| CN | 109887961 | 6/2019 |

(Continued)

*Primary Examiner* — Matthew E. Gordon
(74) *Attorney, Agent, or Firm* — JCIPRNET

(57) ABSTRACT

A display device includes a circuit substrate, multiple light-emitting elements, a color conversion layer, and a bank. The light-emitting elements are disposed on and electrically connected to the circuit substrate, respectively. The color conversion layer is disposed on a first light-emitting element of the light-emitting elements. The bank is disposed between the light-emitting elements. There is a gap between the bank and the color conversion layer. A manufacturing method of a display device is also provided.

20 Claims, 5 Drawing Sheets

(56) References Cited

U.S. PATENT DOCUMENTS

| | | | |
|---|---|---|---|
| 2020/0365774 A1* | 11/2020 | Zhang | .................... H01L 33/58 |
| 2021/0175302 A1 | 6/2021 | Cui | |
| 2021/0328181 A1 | 10/2021 | Wang | |
| 2022/0029047 A1* | 1/2022 | Yueh | .................... H01L 33/005 |
| 2022/0320382 A1* | 10/2022 | Chen | .................... H01L 33/505 |
| 2022/0352238 A1* | 11/2022 | Kim | ........................ H01L 33/60 |
| 2023/0064695 A1* | 3/2023 | Jeon | .................... H01L 33/387 |
| 2023/0122324 A1* | 4/2023 | Jeon | .................... H01L 27/156 |
| | | | 257/91 |

FOREIGN PATENT DOCUMENTS

| CN | 110335958 | | 10/2019 | |
|---|---|---|---|---|
| CN | 111048648 | | 4/2020 | |
| CN | 111048648 A | * | 4/2020 | ......... H01L 21/6835 |
| CN | 105047683 | | 6/2020 | |
| CN | 112186016 | | 1/2021 | |

* cited by examiner

DISPLAY DEVICE INCLUDING GAP BETWEEN BANK AND LIGHT-EMITTING ELEMENT, AND MANUFACTURING METHOD THEREOF

CROSS-REFERENCE TO RELATED APPLICATION

This application claims the priority benefit of Taiwan application serial no. 110131888, filed on Aug. 27, 2021. The entirety of the above-mentioned patent application is hereby incorporated by reference herein and made a part of this specification.

BACKGROUND

Technological Field

The disclosure relates to a display device and a manufacturing method thereof, and particularly, to a display device with improved flexibility and display quality and a manufacturing method thereof.

Description of Related Art

Compared with other display technologies, Micro-LED displays have the advantages of power saving, high efficiency, high brightness, and fast response time. Currently, in the manufacturing process of a Micro-LED display, mass transfer technology is adopted to transport a large number of Micro-LED dies onto the substrate due to the extremely small size of Micro-LEDs. The mass transfer yield still needs to be improved, and the LED dies with multiple types of color light need to undergo mass transfer process much more times, so all LED dies with the same color light can obtain relatively high mass transfer yield. In this case, a color conversion layer is required to convert the light emitted by the LED dies into light of different colors to provide a full-color display effect.

At present, in the configuration method of the color conversion layer, first banks are disposed between the micro-LED dies to define the position of the color conversion layer, and then the color conversion layer is formed between the banks and covers the micro-LED dies. In addition, due to the extremely small gap of the micro-LEDs, the high reflectivity of the banks may also solve the problem of lateral light mixing between sub-pixels. However, the rigid banks and the color conversion layer are not flexible, so cracks occur during the production of the flexible micro-LED display, causing display abnormalities. In addition, the banks with high reflectivity still have transmittance of about 10%. Therefore, there is still a problem of poor display quality caused by color shift due to light mixing.

SUMMARY

The disclosure provides a display device with improved flexibility and display quality.

In an embodiment of the disclosure, a display device is provided. The display device includes a circuit substrate, multiple light-emitting elements, a color conversion layer, and a bank. The light-emitting elements are disposed on the circuit substrate and electrically connected to the circuit substrate, respectively. The color conversion layer is disposed on a first light-emitting element of the light-emitting elements. The bank is disposed between the light-emitting elements, and there is a gap between the bank and the color conversion layer.

In an embodiment of the disclosure, the gap is greater than 0.1 μm.

In an embodiment of the disclosure, no color conversion layer is disposed on a second light-emitting element of the light-emitting elements.

In an embodiment of the disclosure, a gap between the banks on both sides of the second light-emitting element is less than a gap between the banks on both sides of the first light-emitting element.

In an embodiment of the disclosure, the second light-emitting elements are evenly distributed.

In an embodiment of the disclosure, the color conversion layer is a photoresistive color conversion layer.

In an embodiment of the disclosure, an angle between a sidewall of the color conversion layer and a surface of the circuit substrate is less than 90 degrees.

In an embodiment of the disclosure, the display device further includes a light extraction layer disposed on the color conversion layer.

In an embodiment of the disclosure, a refractive index of the light extraction layer ranges from 1 to 1.8.

In an embodiment of the disclosure, the light extraction layer includes a microlens structure.

In an embodiment of the disclosure, the bank has a continuous or discontinuous strip shape.

In an embodiment of the disclosure, a manufacturing method of a display device is provided. The manufacturing method includes steps as follows. A circuit substrate is provided. Multiple light-emitting elements are formed on the circuit substrate, and the light-emitting elements are electrically connected to the circuit substrate, respectively. A color conversion layer is formed on a first light-emitting element of the light-emitting elements. A bank is formed between the light-emitting elements, and there is a gap between the bank and the color conversion layer.

In an embodiment of the disclosure, the step of forming the light-emitting elements on the circuit substrate is performed by a mass transfer process.

In an embodiment of the disclosure, the step of forming the color conversion layer on the first light-emitting element of the light-emitting elements is performed by a thin film deposition process, a lithography process, and an etching process.

In order to make the features and advantages of the disclosure comprehensible, embodiments accompanied with drawings are described in detail below.

DESCRIPTION OF THE EMBODIMENTS

Figure 1A:
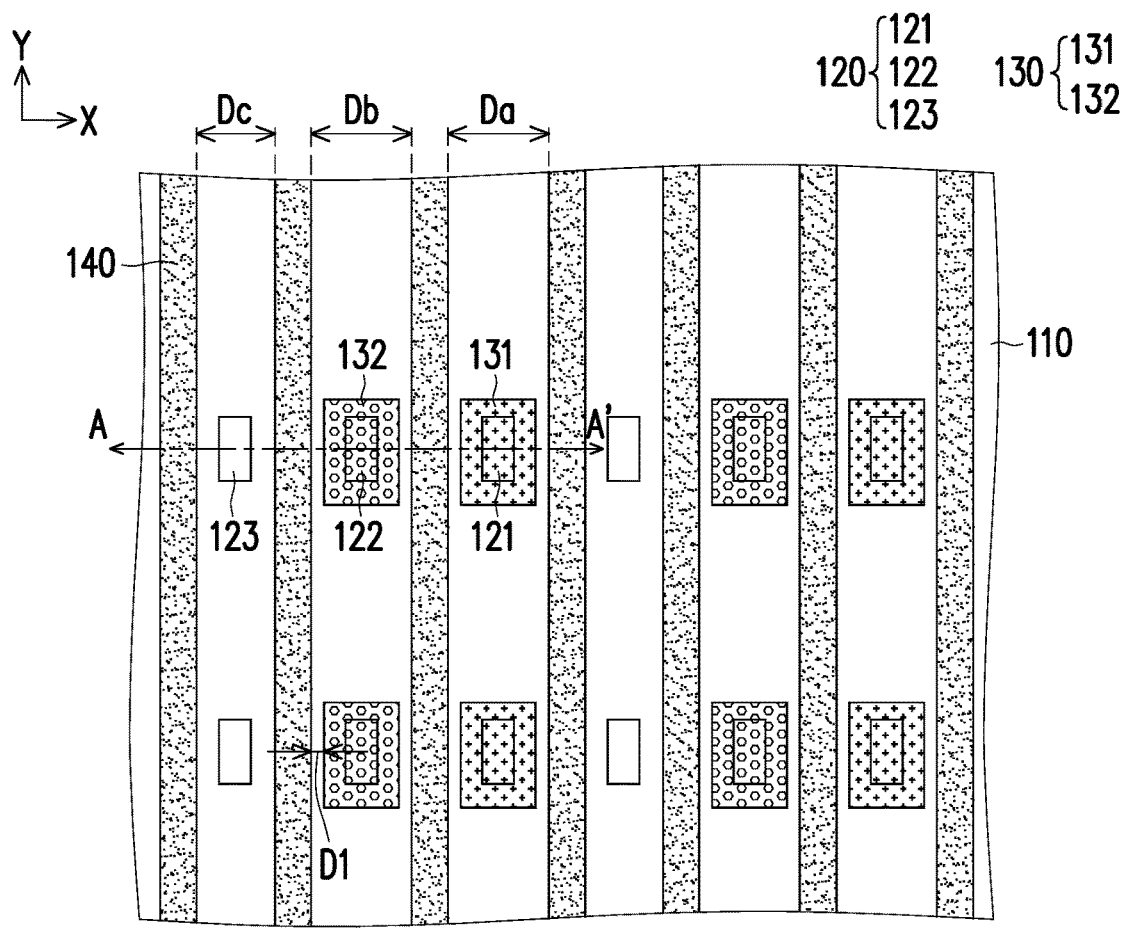
FIG. 1A is a schematic top view of part of a display device 10 according to an embodiment of the disclosure.

In the drawings, thicknesses of layers, films, panels, regions, etc., are enlarged for clarity. Throughout the specification, the same reference numerals denote the same elements. It should be understood that when a device such as a layer, film, region, or substrate is referred to as being "on", or "connected to" another device, it may be directly on or connected to another device, or intervening devices may also be present. In contrast, when a device is referred to as being "directly on" or "directly connected to" another device, no intervening devices are present. As used herein, the term "connection" may refer to physical connection and/or electrical connection. Furthermore, "electrically connection" may encompass the presence of other devices between two devices.

It should be understood that the terms such as "first", "second", "third", and the like in this specification may be used for describing various elements, components, areas, layers, and/or parts, but the elements, components, areas, layers, and/or parts are not limited by such terms. The terms are only used to distinguish one element, component, area, layer, or part from another element, component, area, layer, or part. Therefore, a "first component", "first element", "first region", "first layer", or "first part" discussed below may be referred to as a second element, second component, second region, second layer, or second part without departing from the teachings herein.

The term "about", "similar", "essentially", or "substantially" as used herein is inclusive of the stated value and means within an acceptable range of deviation for the particular value as determined by people having ordinary skill in the art, considering the measurement in question and the error associated with measurement of the particular quantity (i.e., the limitations of the measurement system). For example, "about" may mean within one or more standard deviations or, within ±30%, ±20%, ±10%, or ±5% of the stated value. Furthermore, a relatively acceptable range of deviation or standard deviation may be chosen for the term "about", "similar", "essentially", or "substantially" as used herein based on measurement properties, cutting properties, or other properties, instead of applying one standard deviation across all the properties.

Figure 1B:
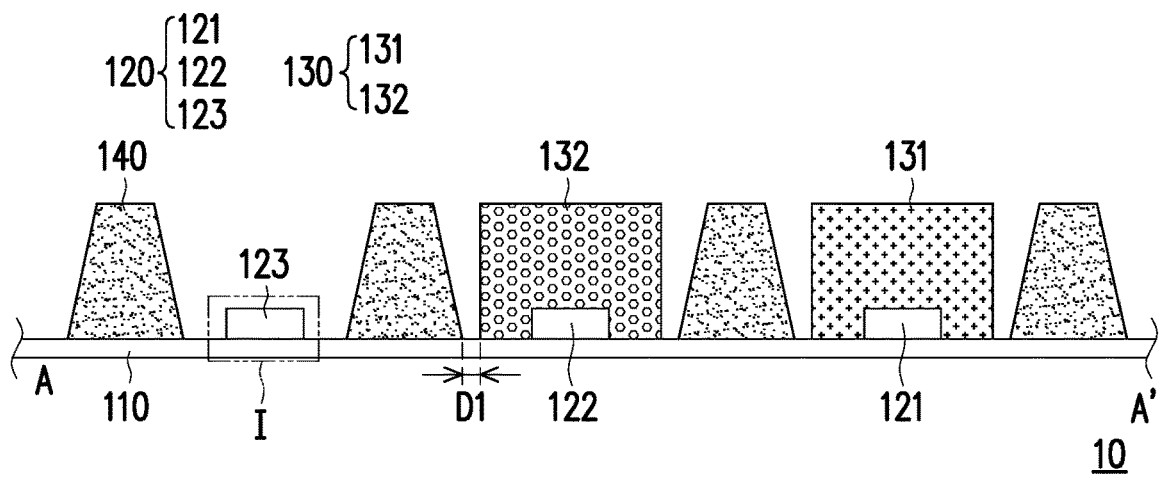
FIG. 1B is a schematic cross-sectional view taken along the section line A-A' of FIG. 1A.
Figure 1C:
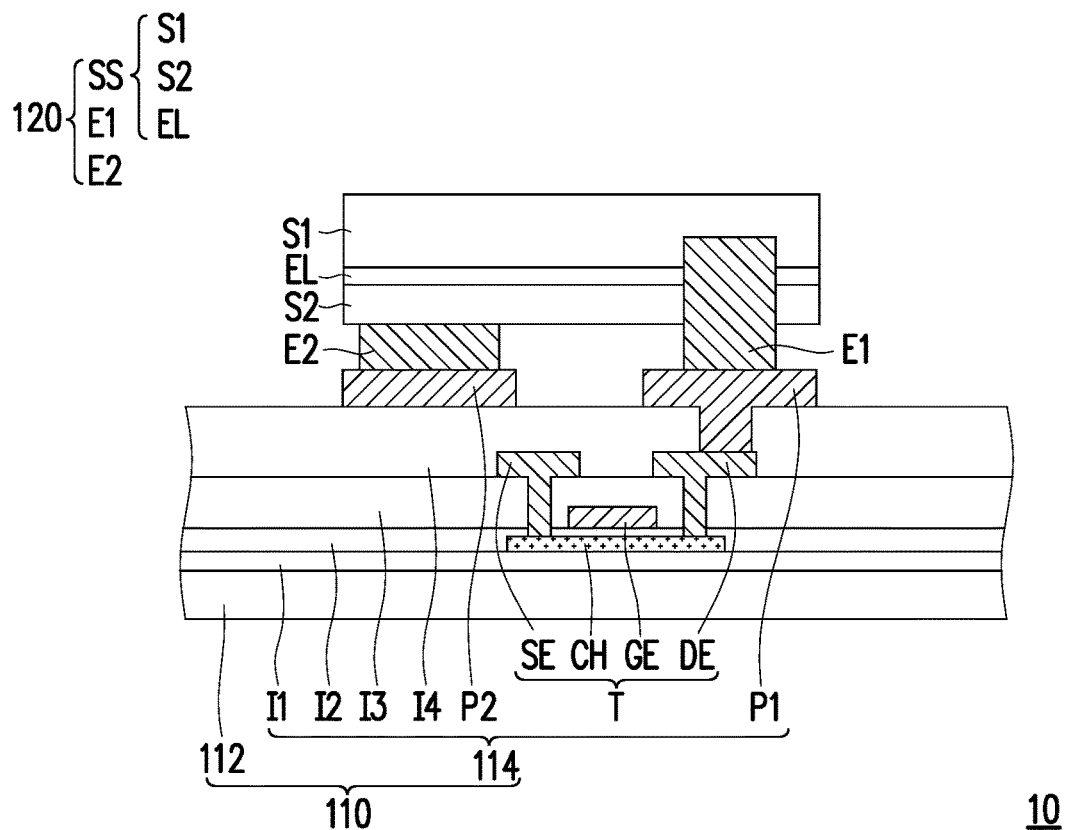
FIG. 1C is an enlarged schematic view of the area I of the display device 10 of FIG. 1B.

FIG. 1A is a schematic top view of part of a display device 10 according to an embodiment of the disclosure. FIG. 1B is a schematic cross-sectional view taken along the section line A-A' of FIG. 1A. FIG. 1C is an enlarged schematic view of the area I of the display device 10 of FIG. 1B. For a concise illustration of the drawings, the detailed structures of a circuit substrate 110 and a light-emitting element 120 in FIG. 1C are omitted in FIG. 1A and FIG. 1B.

Referring to FIG. 1A to FIG. 1C altogether, the display device 10 includes the circuit substrate 110; multiple light-emitting elements 120 are disposed on the circuit substrate 110 and are electrically connected to the circuit substrate 110 respectively; a color conversion layer 130 is disposed on a light-emitting element 121 and a light-emitting element 122 of the light-emitting elements 120; and a bank 140 is disposed between the light-emitting elements 120. There is the gap D1 between the bank 140 and the color conversion layer 130.

In the display device 10 of an embodiment of the disclosure, with the gap D1 between the bank 140 and the color conversion layer 130, the angle where light is emitted from the color conversion layer 130 may be shifted to the direction perpendicular to the circuit substrate 110, thereby reducing the ratio of light penetrating the bank 140 in the lateral direction. Accordingly, the possibility of light mixing may be reduced, and the gap D1 may further provide a space for stress release when the display device 10 is bent.

With reference to FIG. 1A to FIG. 1C, the implementation of each element of the display device 10 is illustrated in the subsequent paragraphs, but the disclosure is not limited thereto.

Referring to FIG. 1C, in the display device 10 of the embodiment, the circuit substrate 110 may include a flexible substrate 112 and a driving circuit layer 114, for example. The flexible substrate 112 of the circuit substrate 110 may be a transparent substrate or a non-transparent substrate, and the material may be polyimide (PI), polycarbonate (PC), polyester (PET), cyclic olefin copolymer (COC), and metallocene-based cyclic olefin copolymer (mCOC), but the disclosure is not limited thereto. The driving circuit layer 114 may include a pad P1 and a pad P2, and the pad P1 and the pad P2 may be electrically connected to the light-emitting element 120. The pad P1 and the pad P2 may have a single-layer structure or a structure with multiple stacked conductive layers. For example, the pad P1 and the pad P2 may include metals, such as aluminum, molybdenum, titanium, copper and may include a structure of the stacked oxide layers, such as indium tin oxide (ITO), indium zinc oxide (IZO), indium gallium zinc oxide (IGZO), or other suitable conductive oxide layers, but the disclosure is not limited thereto.

In some embodiments, the driving circuit layer 114 may also include elements or circuits required by the display device 10, for example driving elements, switching elements, storage capacitors, power lines, driving signal lines, timing signal lines, current compensation lines, detection signal lines, and the like. A thin film deposition process, a lithography process, and an etching process may be used to form the driving circuit layer 114, for example, the driving circuit layer 114 may include an active device array, the active device array may include multiple active devices T disposed in an array, and the active device T may be electrically connected to the pad P1 or the pad P2. Specifically, the driving circuit layer 114 may include an active device T, a buffer layer I1, a gate insulating layer I2, an interlayer insulating layer I3, a planarization layer I4, the pad P1, and the pad P2. The active device T may include a semiconductor layer CH, a gate GE, a source SE, and a drain DE. The region where the semiconductor layer CH is overlapped with the gate GE may be regarded as a channel region of the active device T. The gate insulating layer I2 is disposed between the gate GE and the semiconductor layer CH, and the interlayer insulating layer I3 is disposed between the source SE and the gate GE and between the drain DE and the gate GE. The gate GE and the source SE each may receive signals from a driving element, for example, and the drain DE may be electrically connected to the pad P1 through a through hole in the planarization layer I4. When the gate GE receives the signal and the active device T is turned on, the signal received by the source SE may be transmitted to the pad P1 through the drain DE. In other embodiments, the driving circuit layer 114 may also include more insulating layers and conductive layers as required.

For example, the material of the semiconductor layer CH may include silicon semiconductor materials (e.g., polysilicon, amorphous silicon, and the like), oxide semiconductor materials, and organic semiconductor materials. The materials of the gate GE, the source SE, and the drain DE may include metals with good conductivity. For example, the metals include aluminum, molybdenum, titanium, copper, or a stacked metal layer thereof, but the disclosure is not limited thereto. The materials of the buffer layer I1, the gate insulating layer I2, and the interlayer insulating layer I3 may include transparent insulating materials, such as silicon oxide, silicon nitride, silicon oxynitride, or a stacked layer thereof, but the disclosure is not limited thereto. The material of the planarization layer I4 may include transparent insulating materials, such as organic materials, acrylic materials, siloxane materials, polyimide materials, epoxy materials, and the like, but the disclosure is not limited thereto. The buffer layer I1, the gate insulating layer I2, the interlayer insulating layer I3, and the planarization layer I4 each may also have a single-layer structure or a multi-layer structure. For example, the multi-layer structure is a stacked layer of any two or more layers of the insulating materials.

In the embodiment, each light-emitting element 120 may include a first electrode E1, a second electrode E2, and a light-emitting stack SS, and the first electrode E1 and the second electrode E2 are electrically connected to different layers in the light-emitting stack SS, respectively. The light-emitting stack SS may include two semiconductor layers and a light-emitting layer sandwiched between the two semiconductor layers. The first electrode E1 may be electrically connected to one of the two semiconductor layers, and the second electrode E2 may be electrically connected to the other semiconductor layer. The materials of the first electrode E1 and the second electrode E2 may include nitrides of metals, alloys, and metallic materials, oxides of metallic materials, oxynitrides of metallic materials, other suitable materials, or a stacked layer of metallic materials and other conductive materials or other low-resistance materials.

For example, the light-emitting stack SS may include a first type semiconductor layer S1, a second type semiconductor layer S2, and a light-emitting layer EL sandwiched between the first type semiconductor layer S1 and the second type semiconductor layer S2. One of the first type semiconductor layer S1 and the second type semiconductor layer S2 may be an N-type doped semiconductor, and the other may be a P-type doped semiconductor. In addition, the first type semiconductor layer S1 and the second type semiconductor layer S2 may include II-VI group materials (e.g., zinc selenium (ZnSe)), III-V nitride materials (e.g., gallium nitride (GaN), gallium arsenide, indium nitride (InN), indium gallium nitride (InGaN), aluminum gallium nitride (AlGaN), aluminum indium gallium nitride (AlInGaN)), or aluminum gallium indium phosphide (AlGaInP). For example, in the embodiment, the first type semiconductor layer S1 is an N-type doped semiconductor layer, for example, and the material of the N-type doped semiconductor layer is N-type gallium nitride (n-GaN), for example. The second-type semiconductor layer S2 is a P-type doped semiconductor layer, for example, and the material of the P-type doped semiconductor layer is P-type gallium nitride (p-GaN), for example, but the disclosure is not limited thereto. Moreover, the structure of the light-emitting layer EL is a MQW (MQW) structure, for example, and the MQW structure may include alternately stacked multiple layers of indium gallium nitride (InGaN) and multiple layers of gallium nitride (GaN). With the ratio design of indium or gallium in the light-emitting layer EL, the light emitting wavelength range of the light-emitting layer may also be adjusted, but the disclosure is not limited thereto.

After being manufactured on a growth substrate (e.g., a sapphire substrate), the light-emitting element 120 may be transferred to the circuit substrate 110 through a mass transfer process. The first electrode E1 may be electrically connected to the pad P1, and the second electrode E2 may be electrically connected to the pad P2. In some embodiments, solder, conductive glue, or other conductive materials may be included between the first electrode E1 and the pad P1 and between the second electrode E2 and the pad P2.

Referring to both FIG. 1A and FIG. 1B, in the embodiment, the light-emitting element 120 may include light-emitting elements 121, 122, and 123. Moreover, the light-emitting elements 121, 122, and 123 may all be blue light-emitting diodes, that is, the light-emitting elements 121, 122, and 123 all emit blue light, but the disclosure is not limited thereto. To provide a full-color image display, color conversion layers 131 and 132 are disposed on the light-emitting elements 121 and 122, respectively. For example, the color conversion layer 131 may convert the blue light emitted by the light-emitting element 121 into red light, and the color conversion layer 132 may convert the blue light emitted by the light-emitting element 122 into green light, so that the light-emitting elements 121, 122, and 123 may constitute a pixel of the display device 10. Therefore, in the embodiment, the color conversion layer 130 may include color conversion layers 131 and 132, and the color conversion layer 130 may not be disposed on the light-emitting element 123. In some embodiments, an optical layer that facilitates the light-emitting element 123 to emit light may be disposed on the light-emitting element 123.

In some embodiments, the light-emitting elements 121, 122, and 123 may not all be blue light-emitting diodes. For example, in some embodiments, the light-emitting elements 121 and 123 may both be blue light-emitting diodes, and the light-emitting element 122 may be green light-emitting diodes. Accordingly, the color conversion layer 131 may be disposed only on the light-emitting element 121, and the color conversion layer 132 is not required to be disposed on the light-emitting element 122.

Generally speaking, the color conversion layer 130 may include phosphors, quantum dots (QD), or similar wavelength conversion materials, such as silicates, silicon nitrides, sulfides, quantum dots, or garnets, so that the light emitted by the light-emitting element 120 is converted into light with a desired color. For example, in the embodiment, the color conversion layers 131 and 132 may be photoresistive color conversion layers, and the color conversion layers 131 and 132 may each include a photoresist matrix and phosphors containing different activators. Accordingly, the activator in the phosphor of the color conversion layer 131 may be excited by the blue energy from the light-emitting element 121 to release red light, and the activator in the phosphor of the color conversion layer 132 may be excited by the blue energy from the light-emitting element 122 to release green light.

In the embodiment, the bank 140 may include multiple strip structures, each of the strip structures may have a continuous strip shape extending along the direction Y, and the strip structures of the bank 140 may be disposed along the direction X. In the direction X, there may be the gap D1 between the bank 140 and the color conversion layer 130. Accordingly, when the display device 10 is bent in the direction X, the gap D1 may provide additional compression and expansion space and meanwhile contribute to the buffer and the release of bending stress. In the embodiment, the gap D1 may be greater than about 0.1 μm, such as 0.3 μm, 2.0 μm, or 5 μm, but the disclosure is not limited thereto.

In some embodiments, the strip structures of the bank 140 may extend along the direction X and are disposed along the direction Y, and there may be a gap in the direction Y between the bank 140 and the color conversion layer 130 to facilitate the bending of the display device 10 in direction Y.

In the embodiment, there may be a gap Da between the banks 140 on both sides of the light-emitting element 121, there may be a gap Db between the banks 140 on both sides of the light-emitting element 122, and there may be a gap Dc between the banks 140 on both sides of the light-emitting element 123. Since the color conversion layer 130 is not required on the light-emitting element 123, the gap Dc may be less than the gap Da or the gap Db, so that the light-emitting element 123 may be closer to the bank 140 than the light-emitting elements 121 and 122 and provide higher brightness of the light than the light-emitting elements 121 and 122. Accordingly, the light-emitting element 123 may provide a brightness similar to that of the light-emitting elements 121 and 122 at a lower operating voltage than the light-emitting elements 121 and 122, so that the operating power of the light-emitting element 123 may be reduced, thereby further generating energy-saving effects.

In the subsequent paragraphs, other embodiments of the disclosure are further illustrated with reference to FIG. 2A to FIG. 6, reference numerals and relevant content of the elements of the embodiments of FIG. 1A to FIG. 1C are used in the illustration, the same reference numerals are used to denote the same or similar elements, and the illustration of the same technical content is omitted. For the omitted illustration, refer to the embodiments of FIG. 1A to FIG. 1C, which is not repeated hereinafter.

Figure 2A:
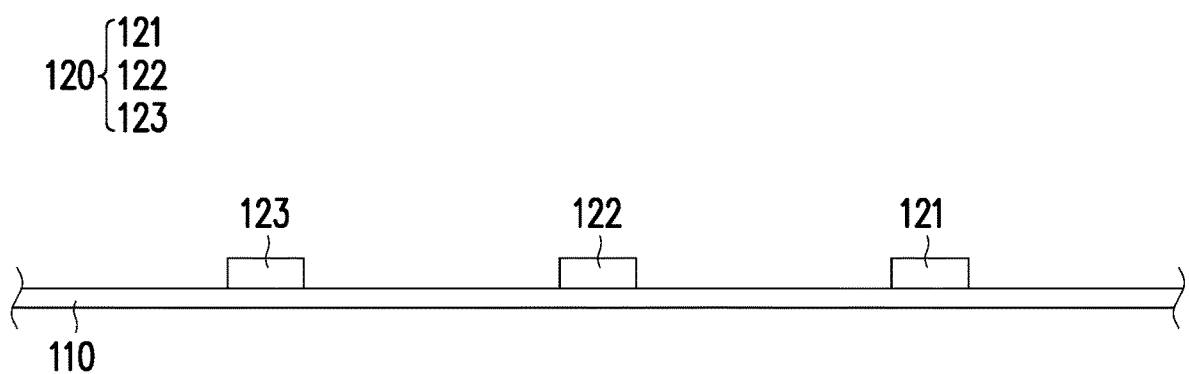
FIG. 2A to FIG. 2B are cross-sectional schematic views of the step flow of the manufacturing method of the display device 10 according to an embodiment of the disclosure.
Figure 2B:
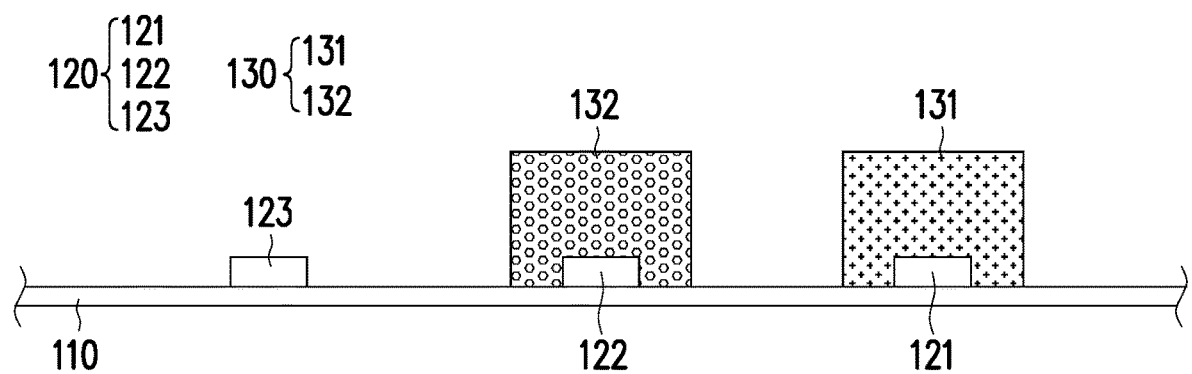

FIG. 2A to FIG. 2B are cross-sectional schematic views of the step flow of the manufacturing method of the display device 10 according to an embodiment of the disclosure. First, referring to FIG. 2A, the circuit substrate 110 is provided. In the embodiment, the circuit substrate 110 may include the flexible substrate 112 and the driving circuit layer 114 as shown in FIG. 1C, and the driving circuit layer 114 including, for example, the active device T, the buffer layer I1, the gate insulating layer I2, the interlayer insulating layer I3, the planarization layer I4, and the pad P1, and the pad P2 may be formed by a thin film deposition process, a photolithography process, and an etching process. Then, the light-emitting elements 120 may be transferred to the circuit substrate 110 by a mass transfer process, the light-emitting elements 120 may include light-emitting elements 121, 122, and 123 that are all blue light-emitting diodes, and the first electrodes E1 and the second electrodes E2 of the light-emitting elements 121, 122, and 123 may be electrically connected to the pad P1 and the pad P2 of the circuit substrate 110, respectively, as shown in FIG. 1C. In addition, the light-emitting elements 121, 122, and 123 may be manufactured on a growth substrate (e.g., a sapphire substrate) by an epitaxial process before undergoing a mass transfer process.

Next, referring to FIG. 2B, the color conversion layer 130 is formed on the light-emitting elements 121 and 122 of the light-emitting elements 121, 122, and 123. For example, in the embodiment, the photoresist color conversion layers 131 and 132 may be formed on the light-emitting elements 121 and 122 by a thin film deposition process, a lithography process, and an etching process, respectively, and the color conversion layer 130 may include color conversion layers 131 and 132. For example, the color conversion layer 131 may convert the blue light emitted by the light-emitting element 121 into red light, and the color conversion layer 132 may convert the blue light emitted by the light-emitting element 122 into green light, so that the light-emitting elements 121, 122, and 123 may form a pixel of the display device 10.

Then, the bank 140 is formed between the light-emitting elements 121, 122, and 123 by a thin film deposition process, a lithography process, and an etching process, the display device 10 as shown in FIG. 1B may be formed, and there may be the gap D1 between the bank 140 and the color conversion layer 130. Due to the process limit of the lithography process, the gap D1 may be greater than 0.1 μm, such as 0.3 μm, 2.0 μm, or 5 μm, but it is not limited thereto.

Figure 3:
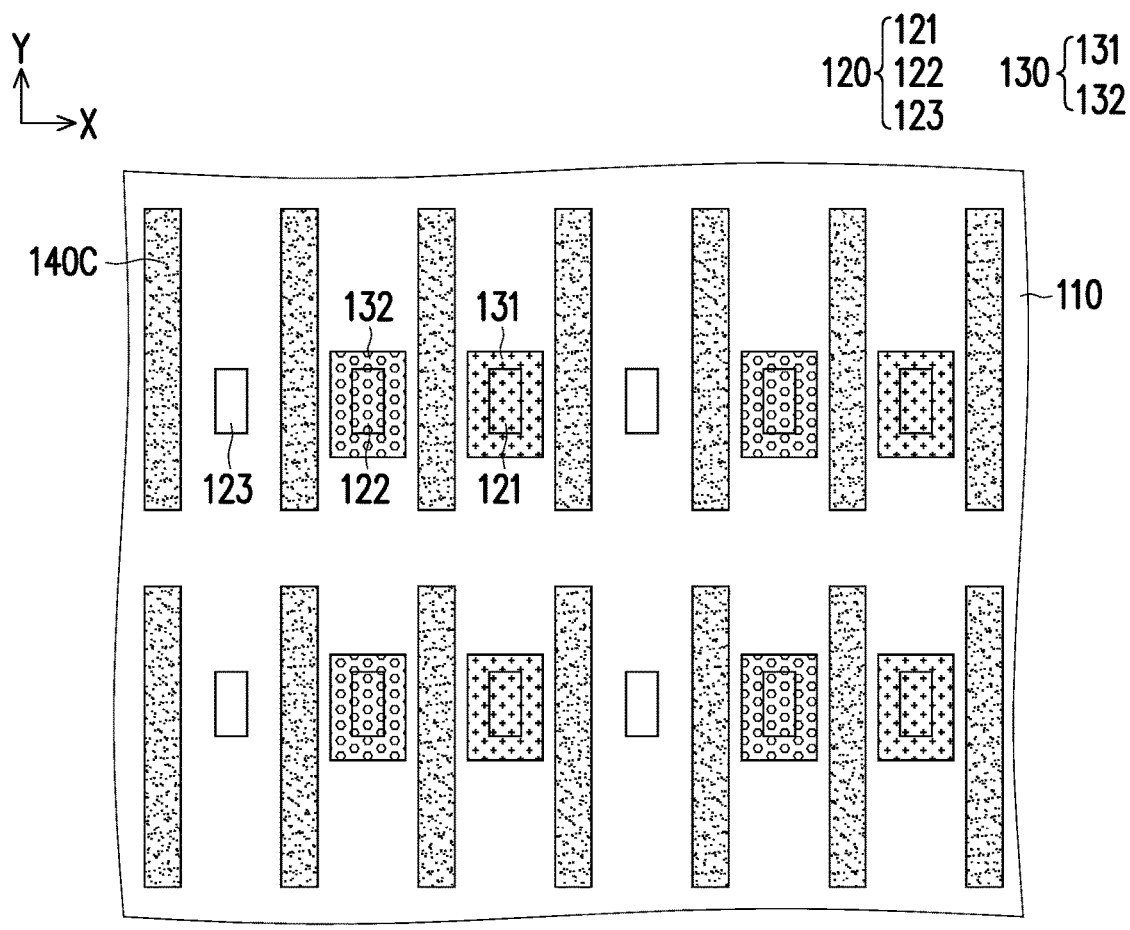
FIG. 3 is a schematic top view of part of a display device 30 according to an embodiment of the disclosure.

FIG. 3 is a schematic top view of part of a display device 30 according to an embodiment of the disclosure. The display device 30 may include the circuit substrate 110, multiple light-emitting elements 120 (including the light-emitting elements 121, 122, and 123), the color conversion layer 130 (including color conversion layers 131 and 132), and a bank 140C.

Compared with the display device 10 shown in FIG. 1A to FIG. 1C, the display device 30 shown in FIG. 3 is different in that the bank 140C of the display device 40 may further include multiple short strip structure disposed between the light-emitting elements 121, 122, and 123, each of the short strip structures may extend along the direction Y, and the short strip structures may be disposed along the direction X and the direction Y, so that the short strip structures in the same column may have a discontinuous long strip shape. Accordingly, the bank 140C is discontinuous in both the direction X and the direction Y, so that when the display device 10 is bent in the direction X or the direction Y, additional compression and expansion spaces may be disposed between the multiple short strip structures of the bank 140C, and thereby contributing to the buffer and the release of bending stress in the direction X and the direction Y.

Figure 4:
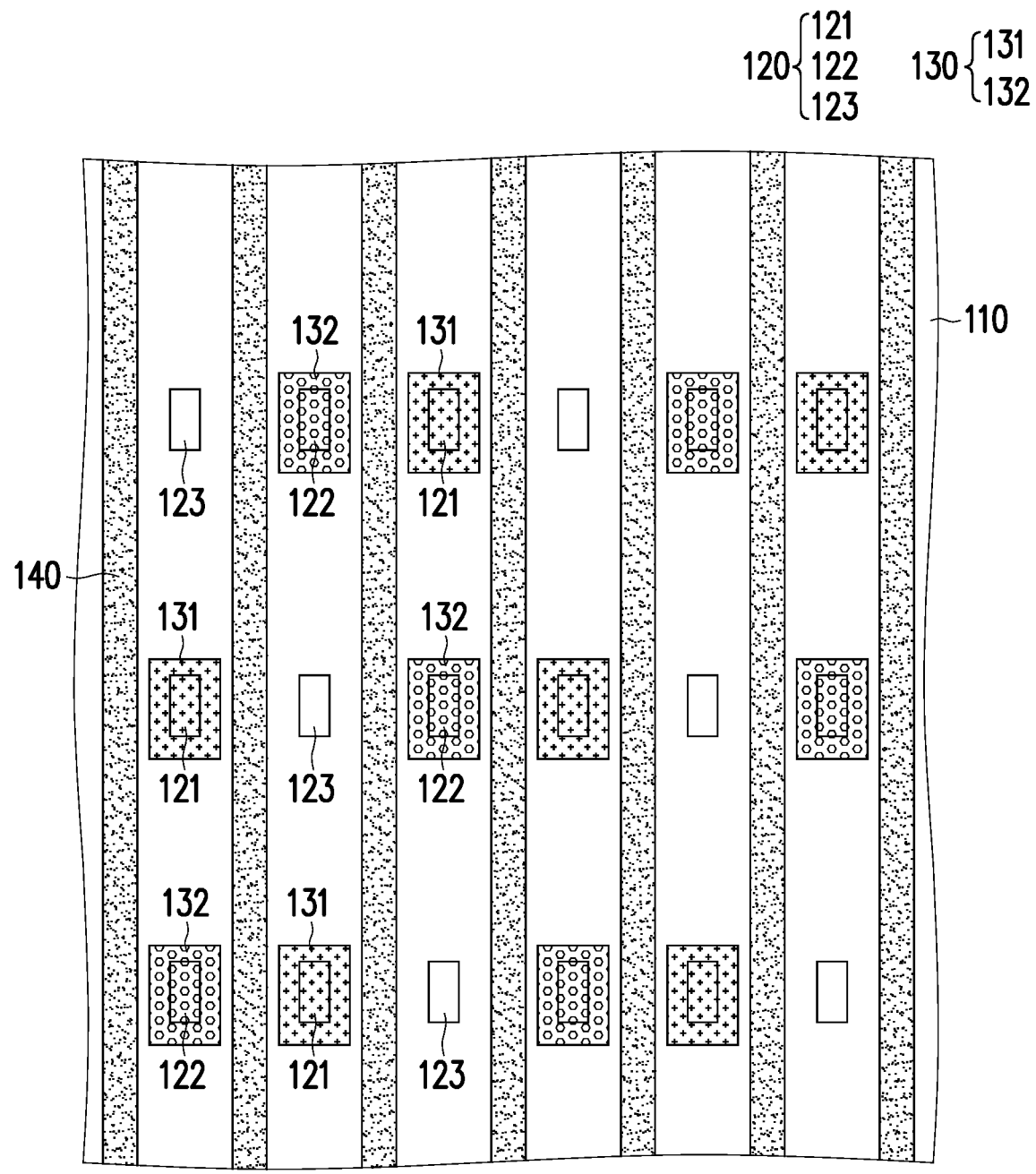
FIG. 4 is a schematic top view of part of a display device 40 according to an embodiment of the disclosure.

FIG. 4 is a schematic top view of part of a display device 40 according to an embodiment of the disclosure. The display device 40 includes the circuit substrate 110, the light-emitting elements 120 (including the light-emitting elements 121, 122, and 123), the color conversion layer 130 (including the color conversion layers 131 and 132), and the bank 140. Compared with the display device 10 shown in FIG. 1A to FIG. 1C, the display device 40 shown in FIG. 4 is different in that the light-emitting elements 123 of the display device 40 are evenly distributed.

For example, in the embodiment, in one group of the light-emitting elements 121, 122, and 123 in the top row, the light-emitting element 123 is disposed on the leftmost side; in one group of light-emitting elements 121, 122, and 123 in the middle row, the light-emitting element 123 is disposed between the light-emitting elements 121 and 122; and in one group of the light-emitting elements 121, 122, and 123 in the bottom, the light-emitting element 123 is disposed at the rightmost side. Since the color conversion layer 130 is not required to be disposed on the light-emitting element 123, the gap between the bank 140 on both sides of the light-emitting element 123 may provide a larger space for the buffer and the release of the compression than the gap between the bank 140 on both sides of the color conversion layer 131 or the bank 140 on both sides of the color conversion layer 132. Therefore, evenly distributing the light-emitting elements 123 may also contribute to improving the bending performance of the display device 40.

Figure 5:
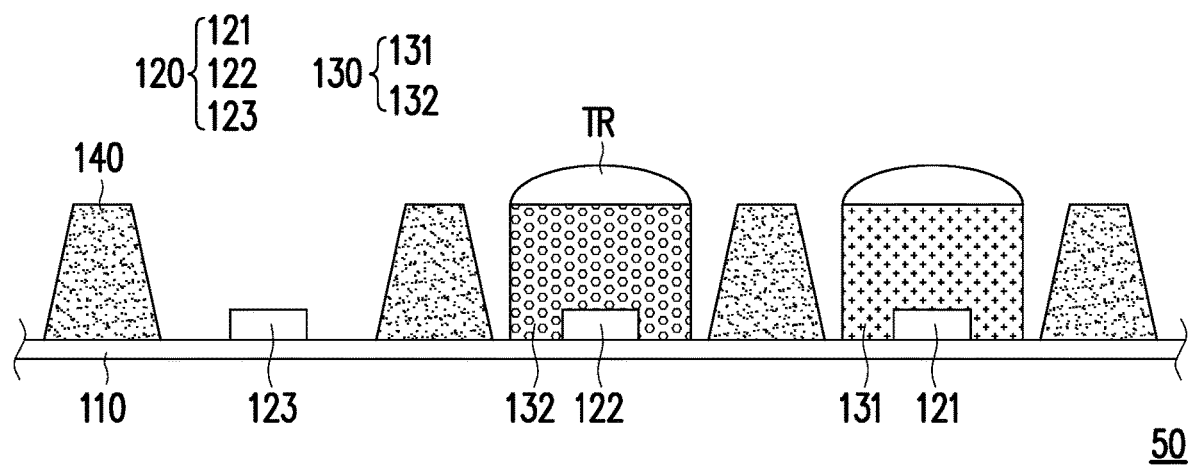
FIG. 5 is a schematic top view of part of a display device 50 according to an embodiment of the disclosure.

FIG. 5 is a schematic top view of part of a display device 50 according to an embodiment of the disclosure. The display device 50 includes the circuit substrate 110, the light-emitting elements 120 (including the light-emitting elements 121, 122, and 123), the color conversion layer 130

(including the color conversion layers 131 and 132), and the bank 140. Compared with the display device 10 shown in FIG. 1A to FIG. 1C, the display device 50 shown in FIG. 5 is different in that the display device 50 further includes a light extraction layer TR on the color conversion layers 131 and 132.

In the embodiment, the refractive index of the light extraction layer TR may be between the refractive index of the color conversion layer 130 and the refractive index of air, for example, ranging from 1 to 1.8, so as to help improve the forward light extraction efficiency and meanwhile reduce the ratio of lateral light emission and effectively suppress light mixing.

In some embodiments, the light extraction layer TR may further include a microlens structure, which may be a lens structure with a center thickness greater than an edge thickness, such as a symmetric biconvex lens, an asymmetric biconvex lens, a plano-convex lens, or a meniscus lens. The microlens structure may improve the light collimation, so that the light leakage and light mixing problems caused by scattered light or refracted light may be improved, thereby improving the light extraction effect.

Figure 6:
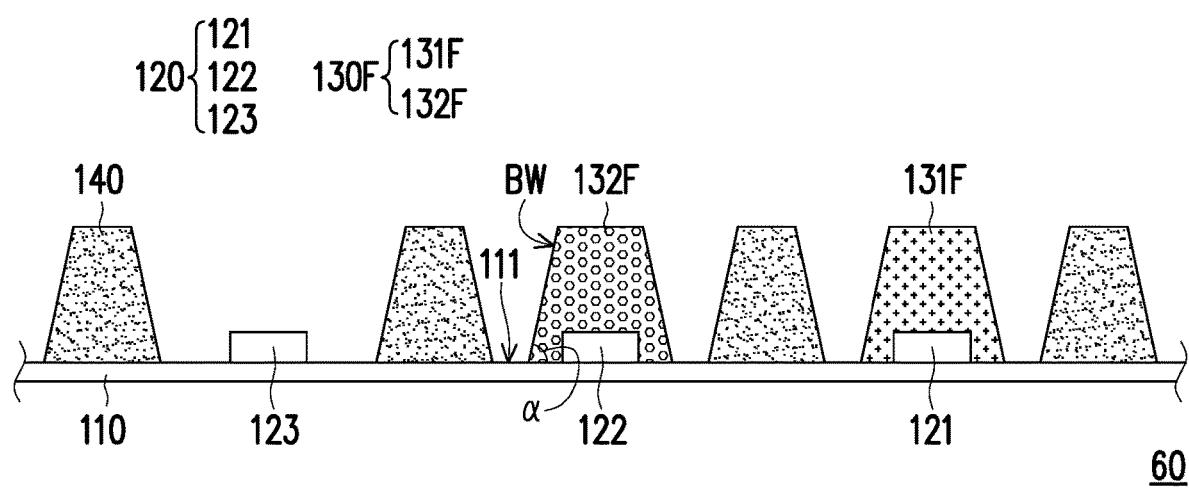
FIG. 6 is a schematic top view of part of a display device 60 according to an embodiment of the disclosure.

FIG. 6 is a schematic top view of part of a display device 60 according to an embodiment of the disclosure. The display device 60 includes the circuit substrate 110, the light-emitting elements 120 (including light-emitting elements 121, 122, and 123), a color conversion layer 130F (including color conversion layers 131F and 132F), and the bank 140.

Compared with the display device 10 shown in FIG. 1A to FIG. 1C, the display device 60 shown in FIG. 6 is different in that an angle α between a sidewall BW of the color conversion layer 130F of the display device 60 and a surface 111 of the circuit substrate 110 may be less than 90 degrees. Accordingly, the angle where light is emitted from the color conversion layer 130F may be further shifted to the direction perpendicular to the circuit substrate 110, thereby reducing the ratio of light penetrating the bank 140 in the lateral direction, thereby improving the forward light emission efficiency.

In summary, in the display device of the disclosure, with the gap between the bank and the color conversion layer, the angle where light is emitted from the color conversion layer may be shifted to the direction perpendicular to the circuit substrate, thereby reducing the ratio of light penetrating the bank in the lateral direction. Accordingly, the possibility of light mixing may be reduced, thereby improving the display quality, and the gap may also provide a space for stress release when the display device is bent, thereby improving the flexibility of the display device.

Although the disclosure has been described with reference to the above embodiments, they are not intended to limit the disclosure. It will be apparent to one of ordinary skill in the art that modifications and changes to the described embodiments may be made without departing from the spirit and the scope of the disclosure. Accordingly, the scope of the disclosure will be defined by the attached claims and their equivalents and not by the above detailed descriptions.

What is claimed is:

1. A display device comprising:
   a circuit substrate;
   light-emitting elements disposed on the circuit substrate and electrically connected to the circuit substrate, respectively;
   a color conversion layer disposed on a first light-emitting element of the light-emitting elements; and
   a bank comprising multiple strip structures extending along a first direction and arranged along a second direction intersecting the first direction, wherein a first strip structure of the multiple strip structures is disposed between the first light-emitting element and a second light-emitting element of the light-emitting elements, and there is a gap between the first strip structure and the color conversion layer,
   wherein no color conversion layer is disposed on the second light-emitting element, and a gap between the first strip structure and a second strip structure of the multiple strip structures disposed respectively on two opposite sides of the second light-emitting element is less than a gap between the first strip structure and a third strip structure of the multiple strip structures disposed respectively on two opposite sides of the first light-emitting element.

2. The display device according to claim 1, wherein the gap between the first strip structure and the color conversion layer is greater than 0.1 μm.

3. The display device according to claim 1, wherein there are multiple second light-emitting elements, and the second light-emitting elements are evenly distributed.

4. The display device according to claim 1, wherein the color conversion layer is a photoresistive color conversion layer.

5. The display device according to claim 1, wherein an angle between a sidewall of the color conversion layer and a surface of the circuit substrate is less than 90 degrees.

6. The display device according to claim 1, further comprising a light extraction layer disposed on the color conversion layer.

7. The display device according to claim 6, wherein a refractive index of the light extraction layer ranges from 1 to 1.8.

8. The display device according to claim 6, wherein the light extraction layer comprises a microlens structure.

9. A manufacturing method of a display device, comprising:
   providing a circuit substrate;
   forming light-emitting elements on the circuit substrate, wherein the light-emitting elements are electrically connected to the circuit substrate, respectively;
   forming a color conversion layer on a first light-emitting element of the light-emitting elements; and
   forming a bank comprising multiple strip structures extending along a first direction and arranged along a second direction intersecting the first direction, wherein a first strip structure of the multiple strip structures is disposed between the first light-emitting element and a second light-emitting element of the light-emitting elements, and there is a gap between the first strip structure and the color conversion layer,
   wherein no color conversion layer is disposed on the second light-emitting element, and a gap between the first strip structure and a second strip structure of the multiple strip structures disposed respectively on two opposite sides of the second light-emitting element is less than a gap between the first strip structure and a third strip structure of the multiple strip structures disposed respectively on two opposite sides of the first light-emitting element.

10. The manufacturing method according to claim 9, wherein the gap between the first strip structure and the color conversion layer is greater than 0.1 μm.

11. The manufacturing method according to claim 9, wherein the color conversion layer is a photoresistive color conversion layer.

12. The manufacturing method according to claim 9, wherein the step of forming the light-emitting elements on the circuit substrate is performed by a mass transfer process.

13. The manufacturing method according to claim 9, wherein the step of forming the color conversion layer on the first light-emitting element of the light-emitting elements is performed by a thin film deposition process, a lithography process, and an etching process.

14. A display device comprising:
a circuit substrate;
light-emitting elements disposed on the circuit substrate and electrically connected to the circuit substrate, respectively;
a color conversion layer disposed on a first light-emitting element of the light-emitting elements; and
a bank comprising multiple strip structures arranged along a first direction and a second direction intersecting the first direction, with the proviso that all the multiple strip structures extend in the same direction and the multiple strip structures are disconnected from any strip structure extending along the second direction, wherein a first strip structure of the multiple strip structures is disposed between the first light-emitting element and a second light-emitting element of the light-emitting elements, and there is a gap between the first strip structure and the color conversion layer.

15. The display device according to claim 14, wherein no color conversion layer is disposed on the second light-emitting element, and a gap between the first strip structure and a second strip structure of the multiple strip structures disposed respectively on two opposite sides of the second light-emitting element is less than a gap between the first strip structure and a third strip structure of the multiple strip structures disposed respectively on two opposite sides of the first light-emitting element.

16. The display device according to claim 14, wherein the color conversion layer is a photoresistive color conversion layer.

17. The display device according to claim 14, wherein an angle between a sidewall of the color conversion layer and a surface of the circuit substrate is less than 90 degrees.

18. The display device according to claim 14, further comprising a light extraction layer disposed on the color conversion layer.

19. A display device comprising:
a circuit substrate;
light-emitting elements disposed on the circuit substrate and electrically connected to the circuit substrate, respectively;
a color conversion layer disposed on first light-emitting elements of the light-emitting elements; and
a bank comprising multiple strip structures extending along a first direction and arranged along a second direction intersecting the first direction, wherein a first strip structure of the multiple strip structures is disposed between the first light-emitting elements and second light-emitting elements of the light-emitting elements, and there is a gap between the first strip structure and the color conversion layer,
wherein no color conversion layer is disposed on the second light-emitting elements, and the second light-emitting elements are evenly distributed in the first direction and misaligned from each other in the second direction.

20. The display device according to claim 19, wherein a gap between the first strip structure and a second strip structure of the multiple strip structures disposed respectively on two opposite sides of one of the second light-emitting elements is less than a gap between the first strip structure and a third strip structure of the multiple strip structures disposed respectively on two opposite sides of one of the first light-emitting elements.

* * * * *